(12) United States Patent  
Kinoshita et al.

(10) Patent No.: US 9,711,725 B2  
(45) Date of Patent: Jul. 18, 2017

(54) METHOD FOR PRODUCING ORGANIC SEMICONDUCTOR ELEMENT

(71) Applicant: FUJIFILM Corporation, Tokyo (JP)

(72) Inventors: Masaru Kinoshita, Kanagawa (JP); Yoshihisa Usami, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 1 day.

(21) Appl. No.: 14/842,574

(22) Filed: Sep. 1, 2015

(65) Prior Publication Data

US 2015/0372234 A1    Dec. 24, 2015

Related U.S. Application Data

(63) Continuation of application No. PCT/JP2014/053881, filed on Feb. 19, 2014.

(30) Foreign Application Priority Data

Mar. 19, 2013   (JP) ................................ 2013-056723

(51) Int. Cl.
  *H01L 51/00* (2006.01)
  *H01L 51/05* (2006.01)
  (Continued)

(52) U.S. Cl.
  CPC ........ *H01L 51/0013* (2013.01); *H01L 51/003* (2013.01); *H01L 51/0031* (2013.01);
  (Continued)

(58) Field of Classification Search
  CPC ............... H01L 51/0013; H01L 51/003; H01L 51/0031; H01L 51/0545; H01L 51/0052;
  (Continued)

(56) References Cited

U.S. PATENT DOCUMENTS

2006/0214160 A1* 9/2006 Furukawa ............. B82Y 10/00
  257/40
2007/0020821 A1   1/2007 Toyoda
  (Continued)

FOREIGN PATENT DOCUMENTS

JP  2004-247716 A   9/2004
JP  2006-303459 A   11/2006
  (Continued)

OTHER PUBLICATIONS

International Preliminary Report on Patentability mailed Oct. 1, 2015 in PCT Application PCT/JP2014/053881, which is related to U.S. Appl. No. 14/842,574.
An Office Action; "Notification of Reasons for Refusal," issued by the Japanese Patent Office on Jan. 26, 2016, which corresponds to Japanese Patent Application No. 2013-056723 and is related to U.S. Appl. No. 14/842,574; with English language translation.
International Search Report from PCT/JP2014/053881 dated Apr. 15, 2014.

*Primary Examiner* — Thanh T Nguyen

(74) *Attorney, Agent, or Firm* — Studebaker & Brackett PC

(57) ABSTRACT

In the method for producing an organic semiconductor element having a semiconductor layer according to the present invention, an optical system for irradiating a laser beam with a wavelength of at least 4 μm and a donor substrate prepared by forming an organic semiconductor film on a surface of a supporting member having a laser beam transmittance of at least 50% are used; and the donor substrate and a substrate to be treated serving as a semiconductor element are opposite one another; the laser beam is irradiated from the supporting member side; the laser beam is scanned while modulating in accordance with the semiconductor layer to be formed; and the organic semiconductor film is transferred to the substrate to be treated so as to form the semiconductor layer.

6 Claims, 3 Drawing Sheets

(51) Int. Cl.
*H01L 51/50* (2006.01)
*H01L 27/32* (2006.01)

(52) U.S. Cl.
CPC ...... *H01L 51/0545* (2013.01); *H01L 27/3244* (2013.01); *H01L 51/5012* (2013.01)

(58) Field of Classification Search
CPC . H01L 51/0054; H01L 51/5012; H01L 51/56; H01L 27/283; H01L 27/3244; H01L 51/0046; H01L 51/0059; H01L 51/0068; H01L 51/0078; H01L 51/0562; H01L 21/76789; H01L 21/76802; H01L 21/76838; H01L 21/76807; H01L 21/76813; H01L 21/76816; H01L 21/76843; H01L 21/76882; H01L 21/7684; H01L 21/76841; H01L 21/76877; H01L 23/528; H01L 23/53209; H01L 23/5329; H01L 23/53238
See application file for complete search history.

(56) References Cited

U.S. PATENT DOCUMENTS

| 2011/0088412 A1* | 4/2011 | Snyder .................. C21D 9/00 62/62 |
| 2011/0089412 A1 | 4/2011 | Fujimori et al. |
| 2011/0136282 A1* | 6/2011 | Shirasawa .......... H01L 51/0013 438/46 |

FOREIGN PATENT DOCUMENTS

| JP | 2006-524916 A | 11/2006 | |
| JP | 2007-35742 A | 2/2007 | |
| JP | 2011-108992 A | 6/2011 | |
| WO | 2004/087434 A1 | 10/2004 | |
| WO | WO 2004087434 A1 * | 10/2004 | ........ B41M 5/38214 |
| WO | 2009/154156 A1 | 12/2009 | |
| WO | 2010/016331 A1 | 2/2010 | |

\* cited by examiner

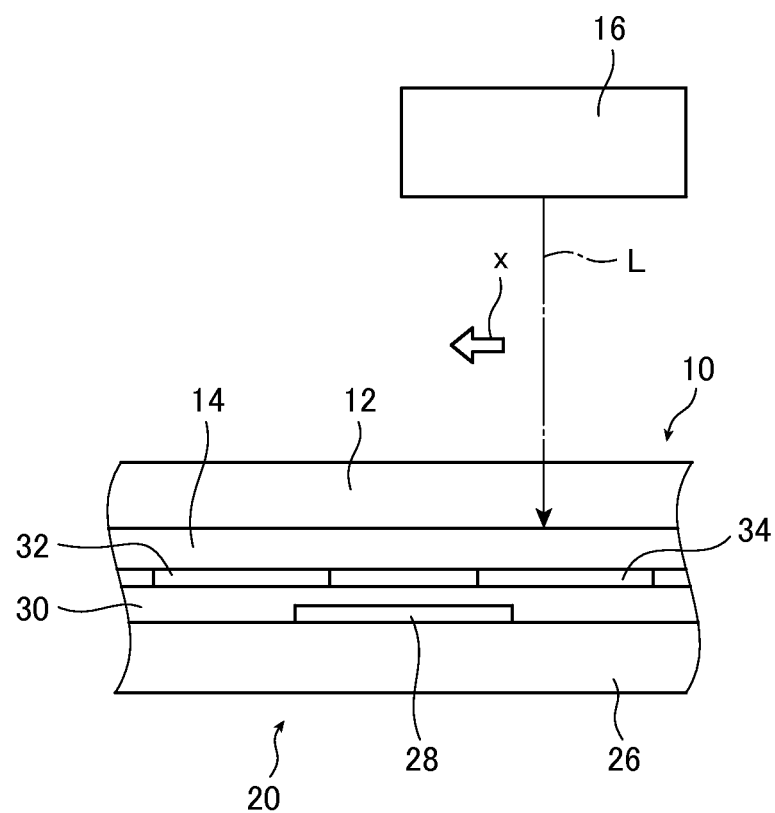

METHOD FOR PRODUCING ORGANIC SEMICONDUCTOR ELEMENT

CROSS-REFERENCE TO RELATED APPLICATIONS

This application is a Continuation of PCT International Application No. PCT/JP2014/053881 filed on Feb. 19, 2014, which claims priority under 35 U.S.C. §119(a) to Japanese Patent Application No. 2013-056723 filed on Mar. 19, 2013. The above application is hereby expressly incorporated by reference, in its entirety, into the present application.

BACKGROUND OF THE INVENTION

The present invention relates to a method for producing an organic semiconductor element such as a thin film transistor using an organic semiconductor material.

Organic semiconductor elements having organic semiconductor layers made of organic semiconductor materials are used in devices using logical circuits such as TFTs (thin film transistors), RFIDs (RF tags), or memory used in liquid crystal displays or organic EL displays due to their ability to reduce weight, lower cost, and enhance flexibility.

In the production of an organic semiconductor element, an organic semiconductor layer is typically formed by a vacuum process such as vacuum deposition or a wet process such as a coating method using a coating prepared by dissolving an organic semiconductor material.

On the other hand, a heat transfer (laser heat transfer) method using a laser, such as that described in JP 2007-35742 A or JP 2011-108992 A, is known as a method that does not require a vacuum process or a wet process.

The formation of an organic semiconductor layer by laser heat transfer is performed using a donor substrate having a photothermal conversion layer over the entire surface of a supporting member capable of transmitting a laser beam, and a film (organic semiconductor film) made of an organic semiconductor material over the entire surface of the photothermal conversion layer.

That is, this donor substrate and a substrate to be treated on which an organic semiconductor layer is to be formed (product in which a gate electrode or an insulating layer is formed on a substrate) are laminated so that the organic semiconductor film and the organic semiconductor layer formation surface are opposite one another, and a laser beam is irradiated from the supporting member side of the donor substrate. As a result of the irradiation of this laser beam, the photothermal conversion layer generates heat at the position where the laser beam is incident, and this heat generation causes the organic semiconductor film to heat, melt, and be transferred to the substrate to be treated so that an organic semiconductor layer is formed. Alternatively, by thermal abrasion caused by the heating of the organic semiconductor film, the organic semiconductor film is transferred to the substrate to be treated so that an organic semiconductor layer is formed.

In the formation of an organic semiconductor layer by such laser heat transfer, it is necessary to produce a donor substrate in advance. However, in laser heat transfer, a vacuum process or a wet process is unnecessary for the formation of an organic semiconductor layer on the substrate to be treated, so it is possible to simplify the process of forming the organic semiconductor layer.

In addition, since heat transfer is possible under a wide variety of conditions, it is possible to incorporate treatment for increasing mobility into the process by adjusting the transfer conditions.

Further, laser heat transfer makes it possible to form an organic semiconductor layer having a uniform film thickness with high pattern precision. Therefore, laser heat transfer yields high prospects for being able to produce an organic semiconductor element which realizes high mobility, high pattern precision, and low performance fluctuation at an excellent level.

On the other hand, with laser heat transfer, the photothermal conversion layer, which reaches a high temperature, is also sometimes transferred in addition to the organic semiconductor layer (organic semiconductor material) at the time of transfer. When such a foreign substance is transferred together with the organic semiconductor layer, this causes a reduction in the performance of the organic semiconductor element due to contamination.

The reason that a photothermal conversion layer is necessary is that organic semiconductor materials do not demonstrate absorption with respect to the wavelengths of near-infrared lasers (780 to 1,000 nm) typically used for laser heat transfer.

On the other hand, using a laser beam in the ultraviolet range as a laser beam with which to perform laser heat transfer makes it possible to heat the organic semiconductor material directly, so the photothermal conversion layer can be omitted. However, when a laser beam in the ultraviolet range is used, there is a concern that the organic semiconductor material may be photochemically decomposed or degraded by the laser beam.

On the other hand, a method for producing an organic semiconductor element in which an organic semiconductor layer is formed by heat transfer using a laser beam in the infrared range without using a photothermal conversion layer is described in JP 2004-247716 A.

In this method, an organic semiconductor layer is formed by laser heat transfer in the same manner as described above using a polyimide as a supporting member and using a donor substrate in which an organic semiconductor film is formed on the surface of the supporting member and a carbon dioxide laser with a wavelength of 10.6 μm.

A carbon dioxide laser with a wavelength of 10.6 μm does not transmit polyimides. That is, in this method, a supporting member made of a polyimide is heated by the laser beam instead of a photothermal conversion layer, and an organic semiconductor layer is transferred to the substrate to be treated by this heat.

Therefore, the polyimide, which reaches a high temperature, is transferred together with the organic semiconductor layer, and this may form a contaminant that diminishes the properties of the organic semiconductor element. In addition, polyimides are typically not materials used for the purpose of photothermal conversion. Therefore, with the heating resulting from the heat generation of the polyimide, it may not be possible to sufficiently transfer the organic semiconductor layer to the substrate to be treated depending on the conditions of laser irradiation or the like, and it may not be possible to produce the target organic semiconductor element.

SUMMARY OF THE INVENTION

An object of the present invention is to solve the problems of such conventional technology and to provide a method for producing an organic semiconductor element with which a high-quality organic semiconductor layer having high definition and a uniform film thickness and exhibiting no contamination or degradation of the organic semiconductor material can be formed by laser heat transfer.

In order to achieve the above object, there is provided a method for producing an organic semiconductor element having a semiconductor layer made of an organic semiconductor material; wherein an optical system for irradiating a laser beam with a wavelength of at least 4 μm and a donor substrate prepared by forming an organic semiconductor film made of the organic semiconductor material on a surface of a supporting member having a laser beam transmittance of at least 50% are used; and the donor substrate and a substrate to be treated serving as a semiconductor element are positioned so that the organic semiconductor film and the semiconductor layer formation surface are opposite one another; the laser beam is irradiated from the supporting member side by the optical system; the laser beam is scanned while modulating in accordance with the semiconductor layer to be formed; and the organic semiconductor film is transferred to the substrate to be treated so as to form the semiconductor layer.

In the method for producing an organic semiconductor element according to the present invention, the organic semiconductor material for forming the organic semiconductor film of the donor substrate is preferably a monocrystal or a polycrystal.

In addition, an energy density of the laser beam at an interface between the supporting member of the donor substrate and the organic semiconductor film is preferably 50 J/cm$^2$.

Further, relative positions of the optical system and the donor substrate are preferably adjusted so that the energy density of the laser beam at an interface between the supporting member of the donor substrate and the organic semiconductor film is from 0.2 to 0.7 times that at the focal position of the laser beam.

In addition, the adjustment of the relative positions of the optical system and the donor substrate is preferably performed so that the optical system and the donor substrate approach one another.

Further, the organic semiconductor film to be transferred to the substrate to be treated is preferably a single phase.

In addition, a scanning spacing of the laser beam is preferably equal to or smaller than a spot diameter of the laser beam at the interface between the supporting member of the donor substrate and the organic semiconductor film.

According to the present invention, a high-quality organic semiconductor layer having high definition and a uniform film thickness and exhibiting no contamination or degradation of the organic semiconductor material can be formed by laser heat transfer, so it is possible to produce a high-performance organic semiconductor element with high mobility.

BRIEF DESCRIPTION OF THE DRAWINGS

FIG. 1 is a conceptual diagram for explaining an example of the organic semiconductor element production method of the present invention.

DETAILED DESCRIPTION OF THE INVENTION

Figure 2A:
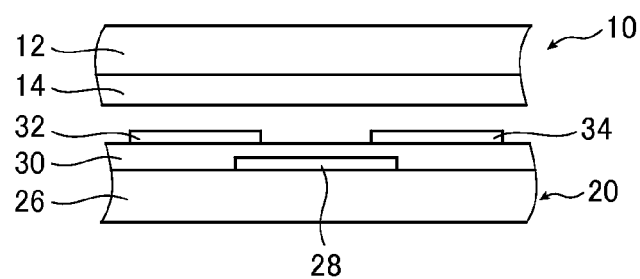
FIG. 2A to FIG. 2E are conceptual diagrams for explaining an example of the organic semiconductor element production method of the present invention.

An example of the organic semiconductor element production method of the present invention is illustrated conceptually in FIG. 1 and FIG. 2A to FIG. 2E.

As illustrated in FIG. 1 and FIG. 2A to FIG. 2E, in the organic semiconductor element production method of the present invention (also simply called the "production method of the present invention" hereafter), a donor substrate 10 produced by forming an organic semiconductor film 14 on the surface of a supporting member 12 and an optical system 16 for irradiating a laser beam L with a wavelength of at least 4 μm are used, and an organic semiconductor layer 24 (see FIG. 2E) is formed on a substrate to be treated 20 serving as a semiconductor element by heat transfer with a laser beam L (laser heat transfer).

In the example illustrated in FIG. 1 and FIG. 2A to FIG. 2E, an organic semiconductor layer 24 is formed on a substrate to be treated 20 having a gate electrode 28 on an element substrate 26, having an insulating layer 30 covering the gate electrode 28 and the element substrate 26, and having a drain electrode 32 and a source electrode 34 on the insulating layer 30.

That is, in this example, a bottom gate/bottom contact type organic semiconductor element is produced. Other than this, however, the present invention can be used to form an organic semiconductor layer in the production of various known organic semiconductor elements such as top gate/bottom contact type, bottom gate/top contact type, and top gate/bottom contact type elements.

The optical system 16 irradiates a laser beam L with a wavelength of at least 4 μm.

This optical system 16 is a known laser optical system (laser beam optical system) formed by combining a laser light source for irradiating a laser beam L with a wavelength of at least 4 μm, various optical elements such as lenses or mirrors, a laser beam modulation means, and the like.

In the production method of the present invention, the laser beam L for performing the heat transfer of the organic semiconductor layer 24 has a wavelength of at least 4 μm.

Organic semiconductor materials typically absorb laser beams with a wavelength of at least 4 μm. As described in detail below, in the production method of the present invention, the organic semiconductor film 14 (organic semiconductor material) is heated directly by this laser beam L so that the organic semiconductor film 14 is laser heat-transferred onto the substrate to be treated 20. The production method of the present invention thus enables the formation of a high-grade organic semiconductor layer 24 having high definition and a uniform film thickness and exhibiting no contamination or contamination of the organic semiconductor material.

From the perspective that this laser heat transfer can be performed favorably, the wavelength of the laser beam L is preferably at least 6 μm and particularly preferably at least 8 μm.

In the production method of the present invention, various known laser beams with a wavelength of at least 4 μm such as a laser beam with a wavelength of 9.3 μm using a carbon dioxide laser, a laser beam with a wavelength of 10.6 μm using a carbon dioxide laser, a laser beam with a wavelength of from 4 to 13 µm using a quantum cascade laser can be used as the laser beam L with a wavelength of at least 4 µm.

Of these, a laser beam with a wavelength of 9.3 µm using a carbon dioxide laser is preferably used from the perspective that the organic semiconductor material efficiently absorbs the laser beam.

The intensity of the laser beam L should be set appropriately to an intensity that allows the organic semiconductor film 14 of the donor substrate 10 to be sufficiently heated and heat-transferred and that does not degrade the organic semiconductor material in accordance with the wavelength of the laser beam L, the type of the organic semiconductor material to be heat-transferred, and the like.

Here, according to the research of the present inventors, the energy density of the laser beam L (beam spot energy density) at the interface between the donor substrate 10 and the organic semiconductor film 14 is preferably at least 50 $J/cm^2$ and particularly preferably at least 80 $J/cm^2$.

As a result, it is possible to heat transfer the organic semiconductor film 14 more reliably so as to form a proper organic semiconductor layer 24, which makes it possible to stably produce an organic semiconductor element which reliably realizes the target performance.

In addition, the donor substrate 10 is preferably irradiated with the laser beam L so that the energy density (beam spot energy density) at the interface between the supporting member 12 of the donor substrate 10 and the organic semiconductor film 14 is from 0.2 to 0.7 times the energy density of the focal position.

In order to most efficiently perform laser heat transfer, it is necessary to irradiate the donor substrate 10 with the laser beam L so that the interface between the supporting member 12 of the donor substrate 10 and the organic semiconductor film 14 is at the focal position (focus point).

However, when the focal point is formed at this interface, the energy of the laser beam L becomes too high, which results in an overheated state and may cause the degeneration or degradation of the organic semiconductor material. In addition, there is a large difference in the energy of the beam spot at the focal point between the center and peripheral portions, and irregularities may develop during the laser heat transfer of the organic semiconductor film 14.

In contrast, in the present invention, the focal position of the laser beam L is preferably shifted from the interface between the supporting member 12 and the organic semiconductor film 14 (the laser beam L is defocused) so that the energy density of the laser beam L at this interface is from 0.2 to 0.7 times that at the focal position.

This makes it possible to properly set the energy density of the laser beam L at the interface between the supporting member 12 and the organic semiconductor film 14 and to uniformize the energy distribution of the beam spot at this interface. Therefore, it is possible to further suitably prevent the decomposition of the organic semiconductor material and perform laser heat transfer without irregularities, which makes it possible to more stably form a proper organic semiconductor layer 24.

An example of defocusing method is a method of setting the positions (optical distances) of the donor substrate 10 and the optical system 16 so that the interface between the supporting member 12 and the organic semiconductor film 14 is at the focal position and moving at least either the donor substrate 10 or the optical system 16 in the optical axis direction of the laser beam L.

Here, this defocusing is preferably performed so that the focal position of the laser beam L is positioned closer to the optical system 16 side than the interface between the supporting member 12 and the organic semiconductor film 14. That is, defocusing is preferably performed so that the focal point of the laser beam L is positioned closer to the upstream side in the advancing direction of the laser beam L than the interface between the supporting member 12 and the organic semiconductor film 14. This makes it possible to reduce the loss of the laser beam L and to perform heat transfer by irradiating the interface between the supporting member 12 and the organic semiconductor film 14 with a laser beam having no distortion, which makes it possible to more stably form a proper organic semiconductor layer 24.

On the other hand, as described above, the donor substrate 10 has a supporting member 12 and an organic semiconductor film 14, which is a film of an organic semiconductor material formed on the surface of the supporting member 12.

The supporting member 12 is a tabular substance (sheet-shaped substance) with a laser beam L transmittance of at least 50%. As described above, the laser beam L is a laser beam with a wavelength of at least 4 µm.

As described in detail below, in the production method of the present invention, the donor substrate 10 is scanned with the laser beam L from the supporting member 12 side in a state in which the organic semiconductor film 14 and the surface of the substrate to be treated 20 where the organic semiconductor layer 24 is formed are opposite one another so as to heat-transfer the organic semiconductor film 14 onto the substrate to be treated 20 and to form an organic semiconductor 24 constituting a semiconductor element.

Here, the laser beam with a wavelength of at least 4 µm is absorbed by the organic semiconductor film 14 (organic semiconductor material). Therefore, at least 50% of the laser beam L is transmitted through the supporting member 12 so that the organic semiconductor film 14 can be directly heated and heat-transferred. Accordingly, in the present invention, it is unnecessary to provide a photothermal conversion layer for heating the organic semiconductor film 14 on the donor substrate 10. Further, this heat transfer is not heat transfer based on the heating of the supporting member 12 but is heat transfer achieved by directly heating the organic semiconductor film 14. Therefore, according to the production method of the present invention, it is possible to form a single phase organic semiconductor layer 24 with no impurities originating from a photothermal conversion layer or a supporting member by means of laser heat transfer. In addition, the organic semiconductor material is never degraded, unlike the case of heat transfer using a laser beam in the ultraviolet range.

Further, since the heat transfer of the organic semiconductor film 14 is realized by the scanning of the laser beam L, it is possible to form an organic semiconductor layer 24 having a uniform thickness and having a high-definition, high-precision pattern. In addition, it is not, of course, necessary for the organic semiconductor film 14 of the donor substrate 10 to be formed by patterning, and it may be formed in a so-called covered state over the entire surface of the supporting member 12.

In the production method of the present invention, various materials with a laser beam L transmittance exceeding 50% can be used as the supporting member 12 in accordance with the laser beam L that is used.

An example of the supporting member 12 is a supporting member made of a material such as silicon, germanium, zinc selenide, zinc sulfide, barium fluoride, or calcium fluoride. The transmittance of a laser beam L with a wavelength of at least 4 µm is at least 50% for these materials.

The laser beam transmittance of the supporting member 12 is preferably higher. Specifically, the laser beam L transmittance of the supporting member 12 is preferably at least 60% and particularly preferably at least 70% from the perspectives of being able to efficiently perform laser heat transfer and being able to suppress the unnecessary heating of the supporting member 12.

The thickness of the supporting member 12 should be set appropriately to a thickness which yields sufficient rigidity (mechanical strength) as a substrate for forming and supporting the organic semiconductor film 14 and which does not substantially hinder the irradiation of the organic semiconductor film 14 with the laser beam L in accordance with the formation material of the supporting member 12.

Taking into consideration the usage efficiency of the laser beam L, the supporting member 12 is preferably thinner as long as the necessary rigidity can be secured.

The organic semiconductor film 14, which is a film made of an organic semiconductor material, is formed on the surface of the supporting member 12. As described above, in the production method of the present invention, the organic semiconductor film 14 is heated directly by a laser beam with a wavelength of at least 4 µm and heat-transferred onto the substrate to be treated 20.

Various known materials that are used as organic semiconductor layers of organic semiconductor elements can be used as the organic semiconductor material for forming the organic semiconductor film 14.

Specific examples include pentacenes such as 6,13-bis(triisopropylsilylethynyl)pentacene (TIPS pentacene), tetramethylpentacene, and perfluoropentacene, anthradithiophenes such as TES-ADT and diF-TES-ADT, benzothienobenzothiophenes such as DPh-BTBT and Cn-BTBT, dinaphthothienothiophenes such as Cn-DNTT, dioxaanthanthrenes such as peri-xanthenoxanthene, rubrenes, fullarenes such as C60 and PCBM, phthalocyanines such as copper phthalocyanine and fluorinated copper phthalocyanine, polythiophenes such as P3RT, PQT, P3HT, and PQT, and polythienothiophenes such as PBTTT.

The thickness of the organic semiconductor film 14 should be set appropriately in accordance with the type of the organic semiconductor material, the thickness of the organic semiconductor layer 24 to be formed, and the like.

According to the research of the present inventors, a thickness of approximately 0.01 to 1 µm is preferable.

The organic semiconductor film 14 is formed using a known film forming technique in accordance with the organic semiconductor material that is used.

A preferable example is formation by a so-called coating method in which a coating solution (coating) is prepared by dissolving an organic semiconductor material serving as the organic semiconductor film 14 in a solvent such as toluene, and this coating is applied to the supporting member 12 and dried. At this time, various known coating methods such as spin coating, drop casting, dip coating, doctor knife coating, and gravure coating can be used as the coating method of the coating.

In addition, a vapor phase deposition method (vapor phase film deposition method) such as vacuum deposition, or a method such as printing can also be suitably used for the formation of the organic semiconductor film 14.

The organic semiconductor film 14 is preferably a crystal such as a monocrystal or a polycrystal and is particularly preferably a monocrystal.

By forming the organic semiconductor film 14 as a crystal, it is possible to form a monocrystalline or polycrystalline organic semiconductor layer 24 and to produce an organic semiconductor element with high mobility.

In addition, various known crystallization methods can be used as the method for crystallizing the organic semiconductor film 14. Specific examples include a method of heating the organic semiconductor film 14 that is formed or a method of drying the film from the end of the coated film when forming the organic semiconductor film 14 with a coating method.

The production method of the present invention will be described in more detail hereinafter with reference to FIG. 2A to FIG. 2E.

Figure 2B:
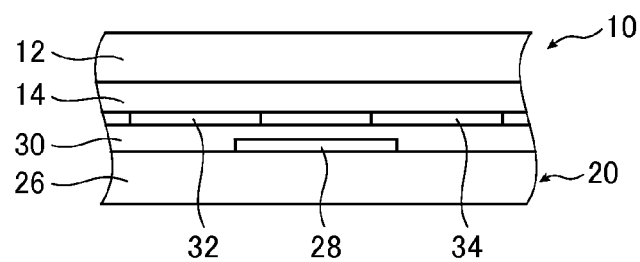

First, as illustrated in FIG. 2A and FIG. 2B, a donor substrate 10 is prepared by forming an organic semiconductor film 14 on the surface of a supporting member 12, and the organic semiconductor film 14 and the surface of the substrate to be treated 20 where the organic semiconductor layer 24 is formed are positioned opposite one another.

As described above, the illustrated example is an example in which a bottom gate/bottom contact type organic semiconductor element is produced. Accordingly, the donor substrate 10 and the substrate to be treated 20 are positioned as that the organic semiconductor film 14 is opposite to the drain electrode 32 and the source electrode 34.

Here, in the example illustrated in FIG. 2A to FIG. 2E (same in FIG. 1), the donor substrate 10 and the substrate to be treated 20 are, for example, laminated in a state in which the organic semiconductor film 14 is in contact with the drain electrode 32 and the source electrode 34.

However, in the production method of the present invention, in addition to a state in which both elements are in contact with one another in this way, the organic semiconductor film 14 and the surface of the substrate to be treated 20 where the organic semiconductor layer 24 is formed may be made to oppose one another in a state in which the donor substrate 10 and the substrate to be treated 20 are separated by a prescribed spacing, as in the state illustrated in FIG. 2A, for example. The spacing between the donor substrate 10 and the substrate to be treated 20 at this time should be set appropriately in accordance with the type of the organic semiconductor material, the intensity of the laser beam L, the constitution of the substrate to be treated 20, and the like.

Here, regardless of whether the donor substrate 10 and the substrate to be treated 20 are laminated in contact with one another or are made to oppose one another at a distance, the donor substrate 10 and the substrate to be treated 20 are preferably made to oppose one another so that the distance between the surface of the organic semiconductor film 14 and the formation surface of the organic semiconductor layer 24 is equal over the entire surface. That is, when laminated as illustrated in FIG. 2A to FIG. 2E, the opposing surfaces of the donor substrate 10 and the substrate to be treated 20 are preferably laminated so as to be in close contact over the entire surface.

This makes it possible to perform the laser heat transfer of the organic semiconductor film 14 uniformly over the entire surface of the donor substrate 10 (formation surface of the organic semiconductor layer 24) and to form a uniform and proper organic semiconductor layer 24 over the entire surface, which makes it possible to more stably produce a high-grade organic semiconductor element.

As in the illustrated example, when the surface of the substrate to be treated 20 where the organic semiconductor layer 24 is formed has irregularities, the donor substrate 10 and the substrate to be treated 20 should be positioned so that the distance between the surface of the organic semiconductor film 14 and the surface of the element substrate 26 (surface on the donor substrate side) is equal over the entire surface.

Figure 2C:
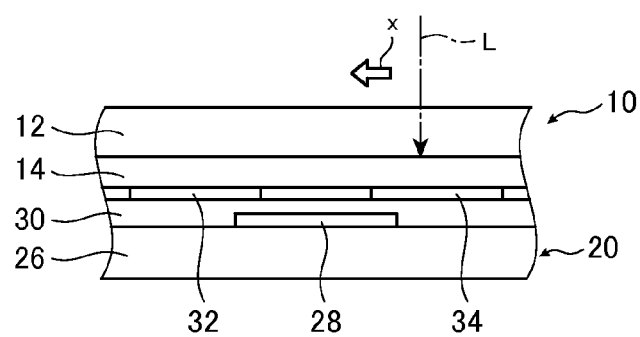
Figure 2D:
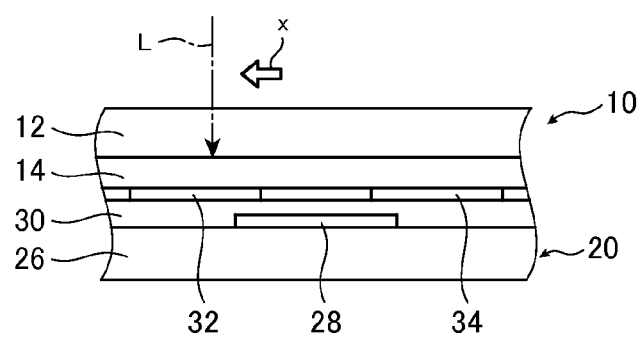

Next, as illustrated in FIG. 2C and FIG. 2D, the donor substrate 10 is irradiated with the laser beam L from the optical system 16, and the donor substrate 10 is two-dimensionally scanned by the laser beam L while modulating the laser beam L in accordance with the organic semiconductor layer 24 to be formed.

In the illustrated example, the donor substrate 10 is two-dimensionally scanned by the laser beam L by repeating the process of scanning the laser beam L in the direction of arrow x in the drawing (scan lines formed in the direction of arrow x=main scanning), moving the laser beam L by a prescribed amount in the y-direction orthogonal to the direction of arrow x (direction perpendicular to the page in FIG. 2A to FIG. 2E; see FIG. 3B) (secondary scanning), and then once again scanning the laser beam L in the direction of arrow x in the drawing.

As described above, the supporting member 12 transmits at least 50% of the laser beam L, so the laser beam L incident on the donor substrate 10 is transmitted through the supporting member 12 so as to irradiate and heat the organic semiconductor film 14. In addition, the laser beam L is a laser beam with a wavelength of at least 4 µm that is absorbed by the organic semiconductor material.

Accordingly, as a result of the scanning of this laser beam L, the portion of the organic semiconductor film 14 (organic semiconductor material) that is irradiated with the laser beam L is heated directly by the laser beam L. As a result of the heating of the organic semiconductor film 14, the organic semiconductor material is dissolved by heat, assumes a deposited state by thermal abrasion or evaporation, or is subjected to a plurality of these factors acting together so that the organic semiconductor film 14 is heat-transferred onto the substrate to be treated 20 and so that the organic semiconductor layer 24 is formed.

In addition, according to the present invention, wherein heat transfer is performed by the two-dimensional scanning of the laser beam L, it is possible to form an organic semiconductor layer 24 having a desired pattern at a desired position of the substrate to be treated 20 by performing laser beam modulation such as turning the laser beam L on/off or adjusting the intensity thereof.

The two-dimensional scanning of the laser beam L may be performed by moving the optical system 16, by moving the donor substrate 10 and the substrate to be treated 20, or by moving both the optical system 16 as well as the donor substrate 10 and the substrate to be treated 20.

Alternatively, an optical deflector may be provided in the optical system 16, and for example, the donor substrate 10 may be two-dimensionally scanned by the laser beam L by relatively moving the optical system 16, the donor substrate 10, and the substrate to be treated 20 in the direction of arrow y (or in the x-direction) while deflecting the laser beam L in the direction of arrow x (or in the y-direction) (main scanning).

In the production method of the present invention, the scanning of the laser beam L is preferably performed in accordance with the spot diameter of the laser beam L at the interface between the supporting member 12 of the donor substrate 10 and the organic semiconductor film 14 so that the spacing between the centers of spots of the laser beam L (the spacing between the centers of scan lines formed in the x-direction in the example illustrated in FIG. 2A to FIG. 2E) is equal to or smaller than the spot diameter. As a result, it is possible to reliably heat the portion of the organic semiconductor film 14 to be heat-transferred and to prevent transfer irregularities or the non-transfer of necessary portions, which makes it possible to more stably form a proper organic semiconductor layer 24.

In addition, the spot diameter of the laser beam at the interface should be set appropriately in accordance with the shape, size, or the like of the organic semiconductor layer 24 to be formed.

Further, the scanning speed (line speed) of the laser beam L should be set appropriately to a scanning speed that enables proper laser heat transfer in accordance with the intensity of the laser beam L, the energy density of the laser beam (beam spot), the laser beam L transmittance of the supporting member 12, the type of the organic semiconductor material, the thickness of the organic semiconductor film 14, and the like.

According to research conducted by the present inventors, the scanning speed of the laser beam L is preferably approximately from 0.01 to 0.5 m/sec.

Figure 2E:
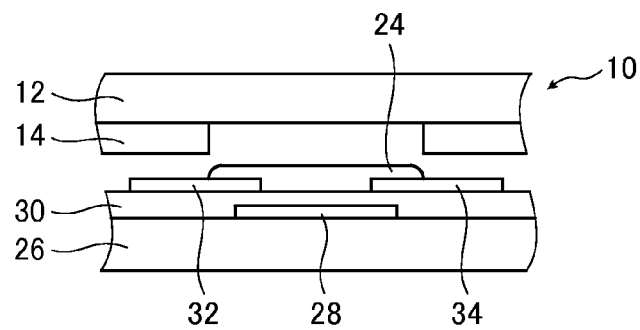

Once the necessary area has been scanned by the laser beam L, as illustrated in FIG. 2E, the donor substrate 10 is removed from the substrate to be treated 20, and a semiconductor element on which the organic semiconductor layer 24 has been formed by heat transfer is retrieved.

As described above, this organic semiconductor layer 24 is formed from an organic semiconductor material prepared by directly heating and heat-transferring the organic semiconductor film 14 of the donor substrate 10 with the laser beam L. Accordingly, the organic semiconductor layer 24 is a high-grade layer having no impurities such as a photothermal conversion layer, exhibiting no degradation of the organic material caused by ultraviolet rays or the like, and having high mobility.

The organic semiconductor element production method of the present invention was described in detail above, but the present invention is not limited to the examples described above, and various improvements or modifications may, as a matter of course, be made without departing from the scope of the present invention.

EXAMPLES

Specific working examples of the present invention will be given hereinafter to describe the organic semiconductor element production method of the present invention in further detail.

Working Example 1

TIPS pentacene was dissolved in toluene to prepare a coating solution for forming an organic semiconductor film 14. The concentration of TIPS pentacene in this coating solution was set to 1 mass %.

An n-type silicon sheet with a thickness of 0.7 mm was prepared as a supporting member 12. The transmittance of this supporting member 12 for a laser beam with a wavelength of 9.3 µm is 90%.

The surface of this supporting member 12 was subjected to UV ozone treatment for 60 seconds.

Next, a donor substrate 10 was produced by applying the prepared coating solution to the surface of the supporting member 12 by spin coating, drying by leaving the solution to stand for ten minutes on a 90° C. hot plate, and thereby forming an organic semiconductor film 14 (TIPS pentacene film) on the surface of the supporting member 12. The thickness of the organic semiconductor film 14 was set to approximately 0.5 µm.

An n-type silicon substrate having a thermal oxide film with a thickness of 300 nm formed on the surface was prepared as a substrate to be treated.

In this example, a bottom gate/top contact type organic semiconductor element is produced, and this n-type silicon substrate acts as a gate electrode.

The thermal oxide film of the substrate to be treated (n-type silicon substrate) and the organic semiconductor film 14 were made to oppose one another, and the substrate to be treated and the donor substrate 10 were laminated with the entire surfaces in close contact with one another (see FIG. 2A to FIG. 2E).

Figure 3A:
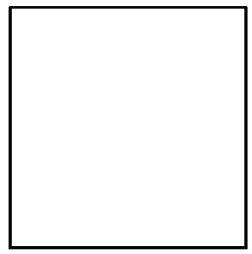
FIG. 3A to FIG. 3C are conceptual diagrams for explaining working examples of the organic semiconductor element production method of the present invention.
Figure 3B:
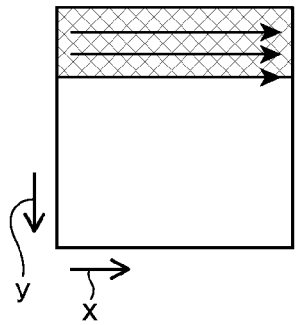
Figure 3C:
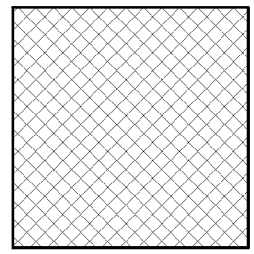

This laminate was irradiated with a laser beam L from the supporting member 12 side using an ML-Z9550T produced by the Keyence Corporation, and the entire surface was scanned by the laser beam L as illustrated conceptually in FIG. 3A to FIG. 3C. The organic semiconductor film 14 was then heat-transferred onto the substrate to be treated from the donor substrate 10, and an organic semiconductor layer was formed on the surface of the substrate to be treated (thermal oxide film).

The laser beam L was a laser beam with a wavelength of 9.3 μm using a carbon dioxide laser, and the output was 18 W. In addition, the focal point of the laser beam L was set to the interface between the supporting member 12 of the donor substrate 10 and the organic semiconductor film 14 (defocusing: 0 mm).

Further, the scanning of the laser beam was performed at a scanning speed (line speed) of 0.02 m/sec at a spacing (scanning pitch) 0.03 mm between the centers of spots of the laser beam at the interface between the supporting member 12 of the donor substrate 10 and the organic semiconductor film 14.

Gold was deposited on the surface of the substrate to be treated on which the organic semiconductor layer was formed (surface of the organic semiconductor layer) so as to form upper electrodes (source electrode and drain electrode), and a bottom gate/top contact type organic semiconductor element (TFT) having an organic semiconductor layer made of TIPS pentacene was thus produced.

Working Example 2 to Working Example 7

Organic semiconductor elements were produced in the same manner as in Working Example 1, respectively: with the exception that the laminate was moved to the optical system side and the focal point of the laser beam was moved 0.1 mm to the substrate to be treated side (defocusing: 0.1 mm, [Working Example 2]);

with the exception that the laminate was moved to the optical system side and the focal point of the laser beam was moved 0.2 mm to the substrate to be treated side (defocusing: 0.2 mm, [Working Example 3]);

with the exception that the laminate was moved to the opposite side of the optical system and the focal point of the laser beam was moved 0.2 mm to the opposite side from the substrate to be treated side (defocusing: 0.2 mm, [Working Example 4]);

with the exception that the laminate was moved to the optical system side and the focal point of the laser beam was moved 1 mm to the substrate to be treated side (defocusing: 1 mm, [Working Example 5]);

with the exception that the laminate was moved to the opposite side from the optical system and the focal point of the laser beam was moved 1 mm to the opposite side from the substrate to be treated side (defocusing: 1 mm, [Working Example 6]); and with the exception that the laminate was moved to the optical system side and the focal point of the laser beam was moved 2 mm to the substrate to be treated side (defocusing: 2 mm, [Working Example 7]).

Working Example 8

An organic semiconductor element was produced in the same manner as in Working Example 1 with the exception that the scanning pitch of the laser beam L was set to 0.1 mm.

Working Example 9

An organic semiconductor element was produced in the same manner as in Working Example 1 with the exception that the scanning speed of the laser beam L was set to 0.2 m/sec.

Comparative Example 1

An organic semiconductor element was produced in the same manner as in Working Example 1 with the exception that the supporting member of the donor substrate was changed to a polyimide (PI) sheet with a thickness of 0.7 mm.

The transmittance of this supporting member for a laser beam with a wavelength of 9.3 μm is 5%.

Comparative Example 2

An organic semiconductor element was produced in the same manner as in Working Example 1 with the exception that the laser beam was changed to a laser beam with a wavelength of 1.064 μm using an Nd:YVO$_4$ laser (using an MD-V9920 produced by the Keyence Corporation). The output of the laser beam was set to 13 W.

Comparative Example 3

An organic semiconductor element was produced in the same manner as in Working Example 1 with the exception that the heat transfer of the organic semiconductor film 14 was performed using a 300° C. hot plate (HP) instead of a laser beam.

The specifications described above as well as the spot diameter of the laser beam L at the interface between the supporting member 12 and the organic semiconductor film 14 (simply called the "interface" hereafter), the energy density of the laser beam L at the interface, and the energy density at the interface with respect to the energy density at the focal position of the laser beam L (interface energy density ratio) are shown in the table below for each of the organic semiconductor elements produced in this way.

Working Example 1 is an example in which the focal position of the laser beam L was at the interface (defocusing: 0 mm), and Working Examples 2 to 7 are examples in which the focal position was moved from the interface by moving the laminate in the optical axis direction of the laser beam L in Working Example 1. Accordingly, the energy density at the focal position in Working Examples 2 to 7 is 359 J/cm$^2$.

<Mobility Measurement>

Each electrode of each bottom gate/top contact type organic semiconductor element produced in this way was connected to each terminal of a manual prober connected to a 4155C produced by Agilent Technologies, and field effect transistor (FET) evaluations were performed. Specifically, the field effect mobility ($[cm^2/V \cdot sec]$) was calculated by measuring the characteristic of the drain current-gate voltage (Id-Vg).

As a result, the field effect mobility was $5.0 \times 10^{-4}$ [$cm^2/V \cdot sec$] in Working Example 1; $5.0 \times 10^{-4}$ [$cm^2/V \cdot sec$] in Working Example 2; $1.0 \times 10^{-3}$ [$cm^2/V \cdot sec$] in Working Example 3; $2.0 \times 10^{-3}$ [$cm^2/V \cdot sec$] in Working Example 4; $2.0 \times 10^{-3}$ [$cm^2/V \cdot sec$] in Working Example 5; $2.0 \times 10^{-3}$ [$cm^2/V \cdot sec$] in Working Example 6; $8.0 \times 10^{-4}$ [$cm^2/V \cdot sec$] in Working Example 7; $2.0 \times 10^{-4}$ [$cm^2/V \cdot sec$] in Working Example 8; and $1.0 \times 10^{-4}$ [$cm^2/V \cdot sec$] in Working Example 9.

In contrast, the mobility could not be measured in Comparative Examples 1 to 3.

The results are listed together in the table below.

TABLE 1

| | Working Example | | | | | | | | | Comparative Example | | |
|---|---|---|---|---|---|---|---|---|---|---|---|---|
| | 1 | 2 | 3 | 4 | 5 | 6 | 7 | 8 | 9 | 1 | 2 | 3 |
| Transfer method | Laser (9.3 μm) | | | | | | | | | | Laser (1.064 μm) | HP (300° C.) |
| Supporting member | Silicon | | | | | | | | | PI | Silicon | |
| Spot diameter [mm] | 0.080 | 0.103 | 0.126 | 0.126 | 0.310 | 0.310 | 0.539 | 0.080 | 0.080 | 0.080 | 0.080 | — |
| Defocusing [mm] | 0 | 0.1 | 0.2 | −0.2 | 1 | −1 | 2 | 0 | 0 | 0 | 0 | — |
| Output [W] | 18 | 18 | 18 | 18 | 18 | 18 | 18 | 18 | 18 | 18 | 13 | — |
| Scanning speed [m/sec] | 0.02 | 0.02 | 0.02 | 0.02 | 0.02 | 0.02 | 0.02 | 0.02 | 0.2 | 0.02 | 0.02 | — |
| Energy density [$J/cm^2$] | 359 | 279 | 228 | 228 | 93 | 93 | 53 | 359 | 36 | 359 | 259 | — |
| Interface energy density ratio | 1 | 0.78 | 0.64 | 0.64 | 0.26 | 0.26 | 0.15 | 1 | 1 | 1 | 1 | — |
| Scanning pitch [mm] | 0.03 | 0.03 | 0.03 | 0.03 | 0.03 | 0.03 | 0.03 | 0.1 | 0.03 | 0.03 | 0.03 | — |
| Mobility [$cm^2/V \cdot sec$] | 5E−0.4 | 5E−0.4 | 1E−0.3 | 2E−0.3 | 2E−0.3 | 2E−0.3 | 8E−0.4 | 2E−0.4 | 1E−0.4 | Unmeasurable | Unmeasurable | Unmeasurable |

As shown in the table above, all of the semiconductor elements (TFTs) produced by the production method of the present invention has good mobility.

Here, as described above, Working Example 1 is an example in which the focal position of the laser beam L was set to the interface (interface between the supporting member 12 and the organic semiconductor film 14) (defocusing: 0 mm). On the other hand, Working Examples 2 to 7 are examples in which the focal position of the laser beam L was moved from the interface by moving (defocusing) the laminate with respect to Working Example 1 so as to change the energy density of the laser beam L at the interface with respect to that at the focal position. As shown in the table above, in Working Examples 3 to 6 in which the energy density at the interface between the supporting member 12 and the organic semiconductor film 14 was set to 0.2 to 0.7 times that at the focal position by moving the focal position, the laser heat transfer of the organic semiconductor film 14 was performed favorably, and even better mobility was achieved.

In contrast, in Comparative Example 1 using a polyimide (PI) as the supporting member of the donor substrate, the polyimide, which is an insulating material, was also transferred together with the organic semiconductor film, and the organic semiconductor element did not operate (unmeasurable). In addition, in Comparative Example 2 using a laser beam with a wavelength of 1.064 μm and Comparative Example 3 using a 300° C. hot plate (HP), the organic semiconductor film 14 could not be heated properly, and the organic semiconductor film 14 was not transferred properly, so the organic semiconductor element similarly did not operate (unmeasurable).

The effect of the present invention is clear from the above results.

What is claimed is:

1. A method for producing an organic semiconductor element having a semiconductor layer made of an organic semiconductor material; wherein
    an optical system for irradiating a laser beam with a wavelength of at least 4 μm and a donor substrate prepared by forming only an organic semiconductor film made of the organic semiconductor material on a surface of a supporting member having a laser beam transmittance of at least 50% are used; and
    the donor substrate and a substrate to be treated serving as a semiconductor element are positioned so that the organic semiconductor film and the semiconductor layer formation surface are opposite one another; the laser beam is irradiated from the supporting member side by the optical system; the laser beam is scanned while modulating in accordance with the semiconductor layer to be formed; and the organic semiconductor film is transferred to the substrate to be treated so as to form the semiconductor layer; and
    relative positions of the optical system and the donor substrate are adjusted so that an energy density of the laser beam at an interface between the supporting member of the donor substrate and the organic semiconductor film is from 0.2 to 0.7 times that at the focal position of the laser beam.

2. The method for producing an organic semiconductor element according to claim 1, wherein the organic semiconductor material for forming the organic semiconductor film of the donor substrate is a monocrystal or a polycrystal.

3. The method for producing an organic semiconductor element according to claim 1, wherein an energy density of the laser beam at an interface between the supporting member of the donor substrate and the organic semiconductor film is at least 50 J/cm$^2$.

4. The method for producing an organic semiconductor element according to claim 1, wherein the adjustment of the relative positions of the optical system and the donor substrate is performed so that the optical system and the donor substrate approach one another.

5. The method for producing an organic semiconductor element according to claim 1, wherein the organic semiconductor film to be transferred to the substrate to be treated is a single phase.

6. The method for producing an organic semiconductor element according to claim 1, wherein a scanning spacing of the laser beam is equal to or smaller than a spot diameter of the laser beam at the interface between the supporting member of the donor substrate and the organic semiconductor film.

\* \* \* \* \*